United States Patent [19]

Yabe

[11] Patent Number: 4,851,717

[45] Date of Patent: Jul. 25, 1989

[54] MASTER SLICE INTEGRATED CIRCUIT CAPABLE OF HIGH SPEED OPERATION

[75] Inventor: Shoji Yabe, Tokyo, Japan

[73] Assignee: NEC Corporation, Tokyo, Japan

[21] Appl. No.: 202,044

[22] Filed: Jun. 3, 1988

[30] Foreign Application Priority Data

Jun. 4, 1987 [JP] Japan ................................ 62-138859

[51] Int. Cl.$^4$ .......................................... H03K 19/177
[52] U.S. Cl. ..................................... 307/465; 307/443; 307/480; 307/591; 307/303; 357/45
[58] Field of Search ............... 307/443, 465, 466, 468, 307/469, 480, 269, 272.1, 591, 303; 357/45; 364/491; 365/63

[56] References Cited

U.S. PATENT DOCUMENTS

| | | | |
|---|---|---|---|
| 3,597,641 | 8/1971 | Ayres | 307/303 |
| 4,523,106 | 6/1985 | Tanizawa et al. | 307/465 |
| 4,584,653 | 4/1986 | Chih et al. | 364/491 |
| 4,611,236 | 9/1986 | Sato | 357/45 |
| 4,639,615 | 1/1987 | Lee et al. | 307/480 X |
| 4,745,084 | 5/1988 | Rowson et al. | 364/491 X |
| 4,750,027 | 6/1988 | Asami | 357/45 |
| 4,755,704 | 7/1988 | Flora et al. | 307/591 X |
| 4,761,567 | 8/1988 | Walters, Jr. et al. | 307/303 X |
| 4,780,753 | 10/1988 | Ohkura et al. | 357/45 X |
| 4,780,846 | 10/1988 | Tanabe et al. | 307/465 X |

OTHER PUBLICATIONS

Anceau et al, "Complex Integrated Circuit Design Strategy", *IEEE JSSC,* vol. SC-17, No. 3, 6-1982, pp. 459-464.

Klein et al, "A Study on Bipolar VLSI Gate-Arrays Assuming Four Layers of Metal", *IEEE JSSC,* vol. SC-17, 6-1982, pp. 472-480.

*Primary Examiner*—David Hudspeth
*Attorney, Agent, or Firm*—Burns, Doane, Swecker & Mathis

[57] ABSTRACT

A master slice integrated circuit comprises a first linear cell array of logic gates and a second linear cell array of first and second groups of flip-flop cells and a clock distributor cell having a plurality of clock outputs. To deduce the size of flip-flop cells and clock propagation times, the flip-flops are formed of custom-made circuit configuration. A wire pattern region is arranged in parallel with the first and second liner cell arrays for interconnecting the logic gates to create cells having desired logic functions and connecting inputs and outputs of the logic function cells to data inputs and outputs of the flip-flop cells and for connecting the clock outputs of the clock distributor cell to the clock inputs of the flip-flop cells. To reduce clock skew, the flip-flop cells of the first group are located adjacent to one end of the second linear cell array and those of the second group are located adjacent to the other end of the array so that the flip-flop cells of each group are located in substantially symmetrical relationships with respect to the clock distributor cell.

3 Claims, 2 Drawing Sheets

MASTER SLICE INTEGRATED CIRCUIT CAPABLE OF HIGH SPEED OPERATION

BACKGROUND OF THE INVENTION

The present invention relates to a master slice integrated circuit which contains arrays of logic cells that can be connected to perform various functions.

As shown in FIG. 1, a prior art master slice integrated circuit comprises clock distributors 5 and flip-flops 4 which are arranged on cells of linear cell arrays together with circuits 10 of other logic functions on a chip substrate 1 and the cell arrays are separated by regions 6 which contain wire patterns for interconnecting between cells. Clock pulses of different repetition frequencies and phases are supplied from clock distributor cells 5 to associated flip-flop cells 4 over separate clock wires 7 which extend across the wire pattern regions 6. The cells on each linear cell array are composed of general purpose, discrete random logic circuits, or gates which are used as basic building blocks to create desired logic functions. The flip-flop cells are typically constructed according to the logic array TTL/SSI 9000 Specifications. According to the logic array specifications, each flip-flop is made up of twelve logic gates and each logic gate is usually composed of five transistors. Each flip-flop thus contains as many as 60 transistors.

Since the general tendency is toward high operating speeds and high level of performance and sophistication, circuit designers have directed their efforts to increasing circuit packing density and minimizing the length of interconnecting wires. With the prior art logic gate technique, the locations of the flip-flop and clock distributor cells depend largely on the locations of the associated logic cells of particular logic functions, and therefore it is almost impossible to shorten the length of the clock wires as desired even though automatic placement programs may be used. From the view points of packing density and clock propagation time, the prior art master slice integrated circuits are not satisfactory, and improvements have been desired.

SUMMARY OF THE INVENTION

It is therefore an object of the present invention to provide a master slice integrated circuit which is capable of high speed operation and high level of performance and sophistication.

The master slice integrated circuit of this invention comprises a first, or general-purpose linear cell array of logic gates and a second, or special-purpose linear cell array including flip-flop cells of custom-made circuit configuration and a clock distributor cell having a plurality of clock outputs, each of the flip-flop cells having data inputs, data outputs and a clock input. To reduce the size of flip-flop cells to less than one half the size of the flip-flop cells of the conventional logic gate configuration, the flip-flop cells are made up of custom-made circuit configuration. A wire pattern region is arranged in paralled with the first and second linear cell arrays for interconnecting the logic gates to create cells having desired logic functions and connecting inputs and outputs of such logic function cells to the data inputs and data outputs of the flip-flop cells and for further connecting the clock outputs of the clock distributor cell to the clock inputs of the flip-flop cells, respectively. Reduction of clock skew is achieved by arranging the clock distributor cell at the center of the second linear cell array and arranging the flip-flop cells of a first group in a location adjacent to one end of the second linear cell array and the flip-flop cells of a second group in a location adjacent to the other end of the second linear cell array so that flip-flop cells of each group are located in substantially symmetrical relationships with respect to the clock distributor cell.

BRIEF DESCRIPTION OF THE DRAWINGS

The present invention will be described in further detail with reference to the accompanying drawings, in which.

DETAILED DESCRIPTION

Figure 1:
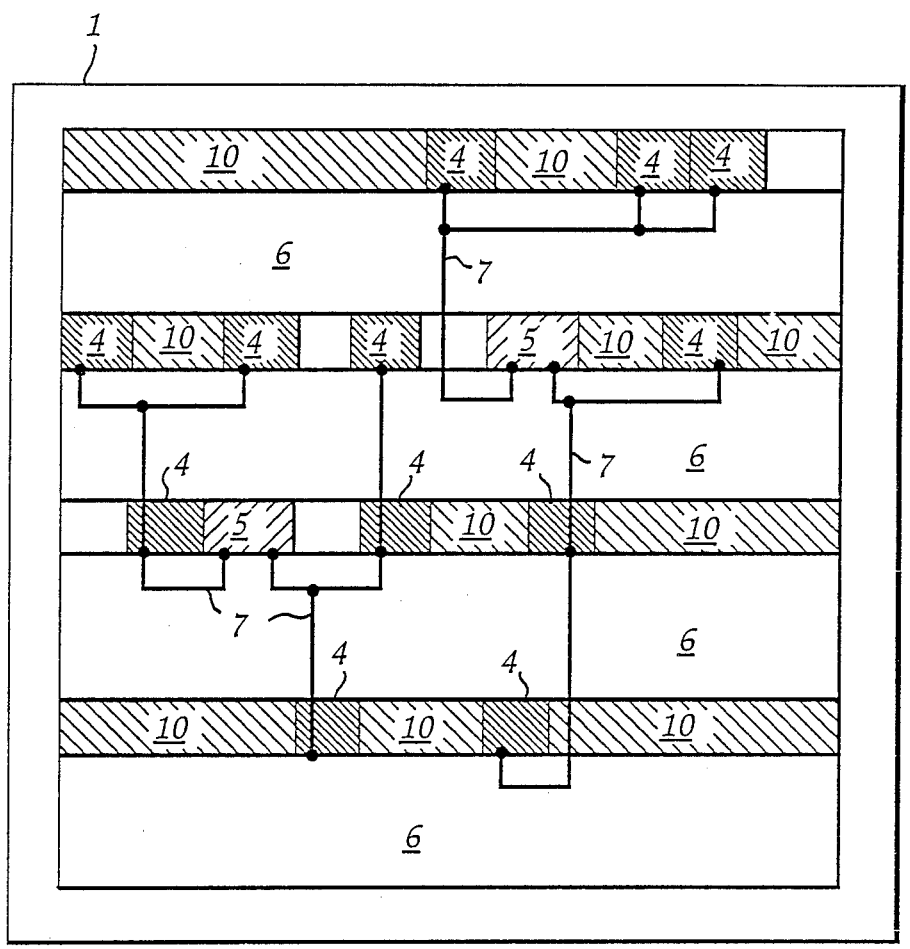
FIG. 1 is a schematic illustration of a prior art master slice integrated circuit chip.
Figure 2:
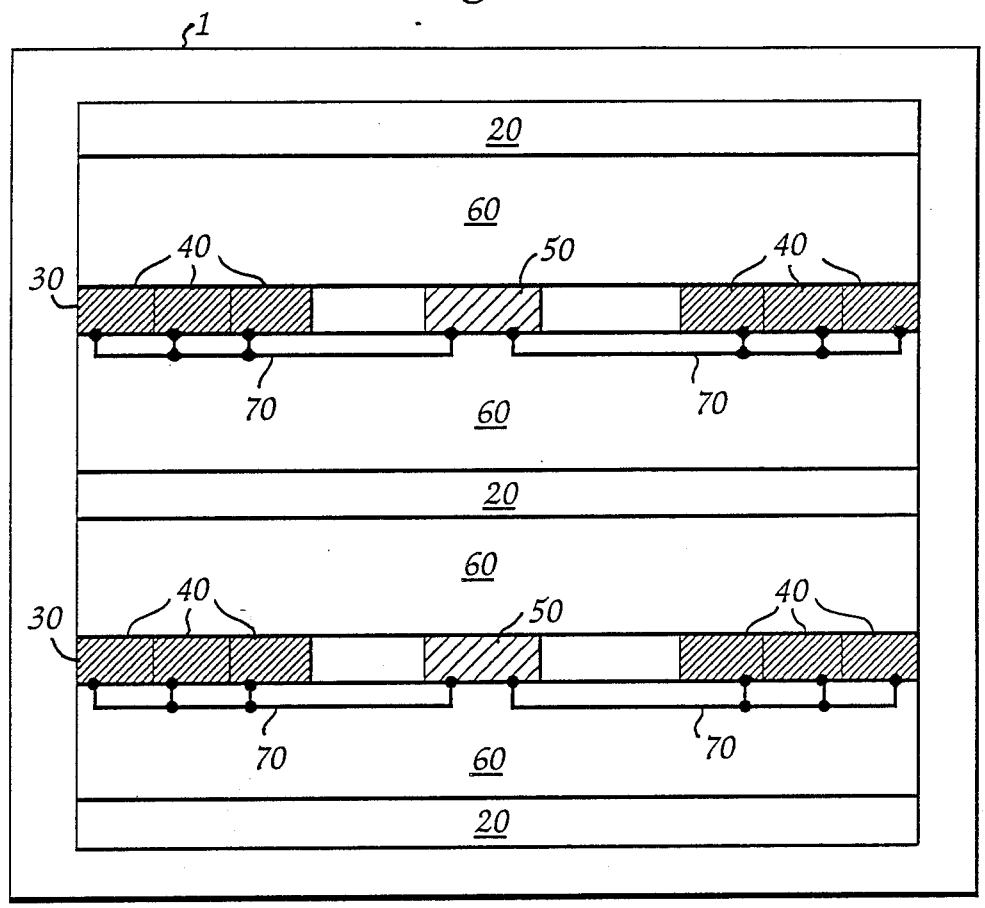
FIG. 2 is a schematic illustration of a master slice integrated circuit chip of the present invention.

In FIG. 2, a master slice integrated circuit of the present invention is shown. Logic gates for creating cells of desired logic functions are arranged exclusively on elongated regions 20, and flip-flop cells 40 and clock distributor cells 50 are arranged exclusively on elongated regions 30. Flip-flop cells 40 and clock distributor cells 50 are composed of custom-made transistor circuits. In a typical example, flip-flop cells 40 are constructed in accordance with the custom-made TTL/SSI 9000 Series Specifications. According to this Specifications, each customized flip-flop 40 comprises twenty-four transistors. With the customization of the flip-flop cells, their cell size can be reduced to less than one half the flip-flop cell size of the prior art logic gate circuit which requires 60 transistors. Wire patterns are formed on regions 60 which are provided on opposite sides of each custom-made cell array 30.

On each custom-made array 30, the clock distributor cell 50 has plural clock outputs which are connected by clock wires 70 to flip-flop cells 40 of different clock groups, with the clock wires 70 extending parallel to the length of the linear cell arrays over wire pattern regions 60. The logic gate arrays 20 and the custom-made circuit arrays 30 are interconnected by wires on the regions 60.

Figure 3:
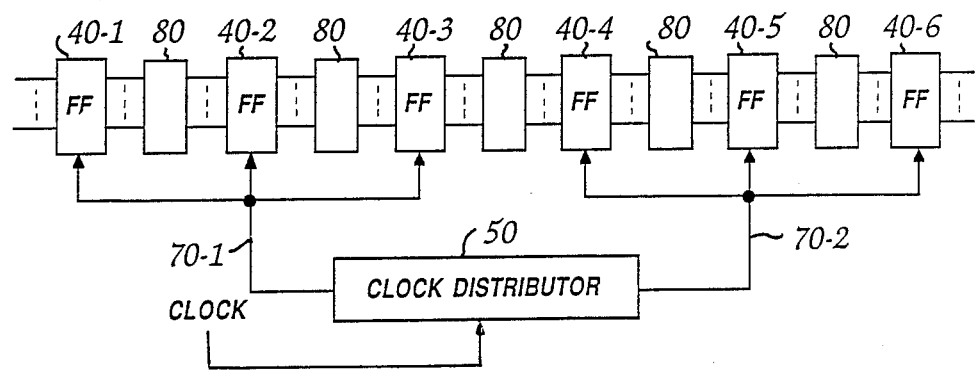
FIG. 3 is a block diagram of each of the custom-made arrays of FIG. 2.

As shown in FIG. 3, the clock distributor cell 50 on each linear cell array 30 receives a clock pulse from a source, not shown, and include at least two clock outputs which are coupled to flip-flop cells 40-1 to 40-3 by a clock wire 70-1 on the one hand and to flip-flops 40-4 to 4-6 by a clock wire 70-2 on the other. These clock wires are laid on the wire pattern regions 60. Regions 60 further include wiring patterns by which the logic gates of the linear cell array 20 are interconnected to create combinatorial circuit cells 80 having desired logic functions and include wiring patterns by which the inputs and outputs of such logic function cells 80 are interconnected.

On each of the custom-made linear cell arrays 30, the clock distributor cell 50 is located at the center of the array and the clock wires 70 of each array are laid in parallel with it so that their length can be minimized, thus enabling the master slice integrated circuit to operate at high speeds. Futhermore, the length of the clock wires can be equalized by arranging the flip-flop cells 40 in symmetrical relationships with respect to the clock distributer cell 50. The equality of the clock wire lengths offers the advantage of a reduced clock skew.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A master slice integrated circuit comprising:
    a first linear cell array of logic gates;
    a second linear cell array of flip-flop cells of custom-made circuit configuration and a clock distributor cell having a plurality of clock outputs, each of said flip-flop cells having data inputs, data outputs and a clock input; and
    a wire pattern region arranged in parallel with said first and second linear cell arrays for interconnecting said logic gates to create cells having desired logic functions, connecting inputs and outputs of said logic function cells to the data inputs and data outputs of said flip-flop cells and for connecting the clock outputs of said clock distributor cell to the clock inputs of said flip-flop cells, respectively.

2. A master slice integrated circuit as claimed in claim 1, wherein said clock distributor cell is located at the center of said second linear cell array.

3. A master slice integrated circuit as claimed in claim 1, wherein said flip-flop cells comprise a group of flip-flops arranged on one end of said second linear cell array and a second group of flip-flops arranged on the other end of said second linear cell array, said flip-flop cells of each of said groups being located in substantially symmetrical relationships with respect to said clock distributor cell.

* * * * *